(12) United States Patent
Lutze et al.

(10) Patent No.: US 8,111,552 B2
(45) Date of Patent: *Feb. 7, 2012

(54) OFFSET NON-VOLATILE STORAGE

(75) Inventors: Jeffrey W. Lutze, San Jose, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/822,546

(22) Filed: Jun. 24, 2010

(65) Prior Publication Data

US 2010/0259988 A1 Oct. 14, 2010

Related U.S. Application Data

(63) Continuation of application No. 11/861,135, filed on Sep. 25, 2007, now Pat. No. 7,760,547.

(51) Int. Cl.
*G11C 11/34* (2006.01)
(52) U.S. Cl. .......... 365/185.05; 365/185.08; 365/185.01
(58) Field of Classification Search ............. 365/185.17, 365/185.05, 185.08, 185.01, 185.23, 185.26, 365/185.27, 185.28, 185.29, 185.14
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 6,643,180 B2 | 11/2003 | Ikehashi | |
| 6,674,623 B1 | 1/2004 | Abe | |
| 6,768,663 B2 | 7/2004 | Ogata | |
| 6,818,504 B2 | 11/2004 | Rabkin | |
| 6,888,755 B2 | 5/2005 | Harari | |
| 7,407,857 B2 * | 8/2008 | Jeno et al. | 438/257 |
| 7,760,547 B2 * | 7/2010 | Lutze et al. | 365/185.05 |
| 2005/0081098 A1 | 4/2005 | Demaray | |
| 2005/0122779 A1 | 6/2005 | Fasoli | |
| 2006/0023513 A1 | 2/2006 | Forbes | |
| 2006/0028869 A1 | 2/2006 | Forbes | |
| 2006/0033144 A1 | 2/2006 | Forbes | |
| 2006/0121674 A1 | 6/2006 | Jeno | |
| 2006/0131639 A1 | 6/2006 | Jenq | |
| 2006/0145241 A1 * | 7/2006 | Forbes et al. | 257/315 |
| 2006/0171209 A1 | 8/2006 | Sim | |
| 2007/0206421 A1 | 9/2007 | Mokhlesi | |
| 2008/0273389 A1 * | 11/2008 | Aritome et al. | 365/185.17 |
| 2009/0080245 A1 | 3/2009 | Lutze | |

FOREIGN PATENT DOCUMENTS

EP 0673070 9/1995

OTHER PUBLICATIONS

Response to Office Action dated Aug. 22, 2011, U.S. Appl. No. 12/822,584, filed Jun. 24, 2010.

(Continued)

*Primary Examiner* — Dang Nguyen
(74) *Attorney, Agent, or Firm* — Vierra Magen Marcus & DeNiro LLP

(57) ABSTRACT

A plurality of non-volatile storage elements on a common active layer are offset from neighbor non-volatile storage elements. This offsetting of non-volatile storage elements helps reduce interference from neighbor non-volatile storage elements. A method of manufacture is also described for fabricating the offset non-volatile storage elements.

8 Claims, 14 Drawing Sheets

OTHER PUBLICATIONS

Office Action dated May 26, 2011, U.S. Appl. No. 12/822,584, filed Jun. 24, 2010.

Jung, et al., "Three Dimensionally Stacked NAND Flash Memory Technology Using Stacking Single Crystal Si Layers on ILD and TANOS Structure for Beyond 30nm Node," 2006 IEEE, 4 pages.

Lai, et al., "A Multi-Layer Stackable Thin-Film Transistor (TFT) Nand-Type Flash Memory," 2006 IEEE, 4 pages.

Nozaki, et al., "A 1-Mb EEPROM with MONOS Memory Cell for Semiconductor Disk Application," IEEE Journal of Solid-State Circuits, vol. 26, No. 4, Apr. 1991, pp. 497-501.

Park, et al., Highly Manufacturable 32Gb Multi-Level NAND Flash Memory with 0.0098 μm2 Cell Size using TANOS (Si—Oxide—Al2O3—TaN) Cell Technology, 2006 IEEE, 4 pages.

Tanaka, et al., "Bit Cost Scalable Technology with Punch and Plug Process for Ultra High Density Flash Memory," Toshiba Corporation, 2 pages, Jun. 14, 2007 IEEE.

International Search Report dated Nov. 11, 2008, PCT Appl. No. PCT/US2008/074641.

Written Opinion of the International Searching Authority dated Nov. 11, 2008, PCT Appl. No. PCT/US2008/074641.

Office Action dated Jun. 25, 2009, U.S. Appl. No. 11/861,135, filed Sep. 25, 2007.

Response to Office Action dated Jul. 10, 2009, U.S. Appl. No. 11/861,135, filed Sep. 25, 2007.

Office Action dated Oct. 13, 22009, U.S. Appl. No. 11/861,135, filed Sep. 25, 2007.

Response to Office Action dated Jan. 12, 2010, U.S. Appl. No. 11/861,135, filed Sep. 25, 2007.

Notice of Allowance dated Mar. 22, 2010, U.S. Appl. No. 11/861,135, filed Sep. 25, 2007.

U.S. Appl. No. 12/822,568, filed Jun. 24, 2010.

U.S. Appl. No. 12/822,584, filed Jun. 24, 2010.

Office Action dated Nov. 9, 2011, U.S. Appl. No. 12/822,584, filed Jun. 24, 2010.

\* cited by examiner

OFFSET NON-VOLATILE STORAGE

This application is a continuation application of U.S. patent application Ser. No. 11/861,135, "OFFSET NON-VOLATILE STORAGE," filed on Sep. 25, 2007, now U.S. Pat. No. 7,760,547, by Lutze, et al., incorporated herein by reference.

CROSS-REFERENCE TO RELATED APPLICATIONS

This application is related to U.S. patent application titled "OFFSET NON-VOLATILE STORAGE," by Lutze, et al., U.S. application Ser. No. 12/822,568, filed on Jun. 24, 2010, and U.S. patent application titled "OFFSET NON-VOLATILE STORAGE," by Lutze, et al., U.S. application Ser. No. 12/822,584 filed on Jun. 24, 2010, both of which are incorporated herein by reference in its entirety.

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory typically utilize a charge storage region that is positioned above and insulated from a channel region in a semiconductor substrate. The charge storage region is positioned between source and drain regions. A control gate is provided over and insulated from the charge storage region. The threshold voltage of the transistor is controlled by the amount of charge that is retained on the charge storage region. That is, the minimum amount of voltage that must be applied to the control gate before the transistor is turned on to permit conduction between its source and drain is controlled by the level of charge in the charge storage region.

One example of a flash memory system uses the NAND structure, which includes arranging multiple transistors in series, sandwiched between two select gates. The transistors in series and the select gates are referred to as a NAND string. Relevant examples of NAND type flash memories and their operation are provided in the following U.S. Patents/Patent Applications, all of which are incorporated herein by reference in their entirety: U.S. Pat. Nos. 5,570,315; 5,774,397; 6,046,935; 6,456,528; and U.S. Pat. Publication No. US2003/0002348. The discussion herein can also apply to other types of flash memory in addition to NAND, as well as other types of non-volatile memory.

When programming an EEPROM or flash memory device, such as a NAND flash memory device, typically a program voltage is applied to the control gate and the bit line is grounded. Electrons from the channel are injected into the floating gate (charge storage layer). When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory," incorporated herein by reference in its entirety.

Some EEPROM and flash memory devices store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored in a charge storage region of a memory cell (e.g., floating gate or charge trap region) can occur because of interference from coupling of an electric field based on the charge stored in adjacent charge storage regions and/or based on charge in the channel of an adjacent NAND string, both of which can interfere with a memory cell targeted for reading.

The interference occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The interference from coupling from nearby charge storage regions and nearby channels is of greater concern for multi-state devices because in multi-state devices the allowed threshold voltage ranges and the forbidden ranges are narrower than in binary devices. Therefore, the interference can result in memory cells experiencing an apparent shift from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multi-state memories than memories using only two states (binary memories). Furthermore, the reduction of the space between word lines and of the space between bit lines will also increase the interference from nearby floating gates and channels.

SUMMARY

One embodiment includes a plurality of non-volatile storage elements on a common active layer. Each of the non-volatile storage elements include a charge storage layer. Each of the non-volatile storage elements has its charge storage layer offset in two perpendicular directions from a charge storage layer of a respective neighbor non-volatile storage element of the plurality of non-volatile storage elements.

One embodiment includes a substrate and a plurality of non-volatile storage elements on the substrate that are vertically offset (with respect to the substrate) from respective neighbor non-volatile storage elements of the plurality of non-volatile storage elements.

One embodiment includes a plurality of non-volatile storage elements that are offset in two perpendicular directions from respective neighbor non-volatile storage elements and a control line coupled to each of the plurality of non-volatile storage elements.

One embodiment includes a plurality of groups of non-volatile storage elements arranged along a first direction. Each group includes non-volatile storage elements sharing a channel region. A first subset of said groups of non-volatile storage elements is offset in a second direction from a second subset of said groups of non-volatile storage elements. A control line is coupled to a non-volatile storage element of each of the groups of non-volatile storage elements.

One embodiment includes a first set of NAND strings on a first substrate and a second set of NAND strings on the first substrate. The second set of NAND strings are interleaved with the first set of NAND strings. The second set of NAND strings is vertically offset from the first set of NAND strings with respect to the substrate.

One embodiment for fabricating such non-volatile storage includes forming a first non-volatile storage element on a first substrate at a first vertical position with respect to the substrate and forming a second non-volatile storage element on the first substrate at a second vertical position with respect to the substrate. The first vertical position is offset from the second vertical position.

One embodiment for fabricating such non-volatile storage includes forming a first set of NAND strings on a first active layer and forming a second set of NAND strings on the first active layer. The second set of NAND strings are formed to be interleaved with the first set of NAND strings. The second set of NAND strings are offset from the first set of NAND strings in two perpendicular directions. One example of two perpendicular directions includes horizontal and vertical directions.

One embodiment for fabricating such non-volatile storage includes creating a first set of active areas on a substrate having a first depth, creating a second set of active areas on the substrate having a second depth, adding charge storage material above the first set of active areas, and adding charge storage material above the second set of active areas. The first set of active areas is interleaved with the second set of active areas. The charge material above the second set of active areas is offset from the charge material above the first set of active areas due to the difference between the first depth and the second depth.

One embodiment for fabricating such non-volatile storage includes creating a first set of active areas on a substrate and creating a second set of active areas on the substrate interleaved with the first set of active areas. Each of the first set of active areas has an active surface. Each of the second set of active areas has an active surface that is lower than the active surfaces of the first set of active areas, with respect to the substrate. The process also includes adding charge storage material above the active surfaces of the first set of active areas at first vertical position with respect to the substrate. The process also includes adding charge storage material above the active surfaces of the second set of active areas at a second vertical position with respect to the substrate. The second vertical position is lower than the first vertical position. with respect to the substrate.

DETAILED DESCRIPTION

Figure 1:
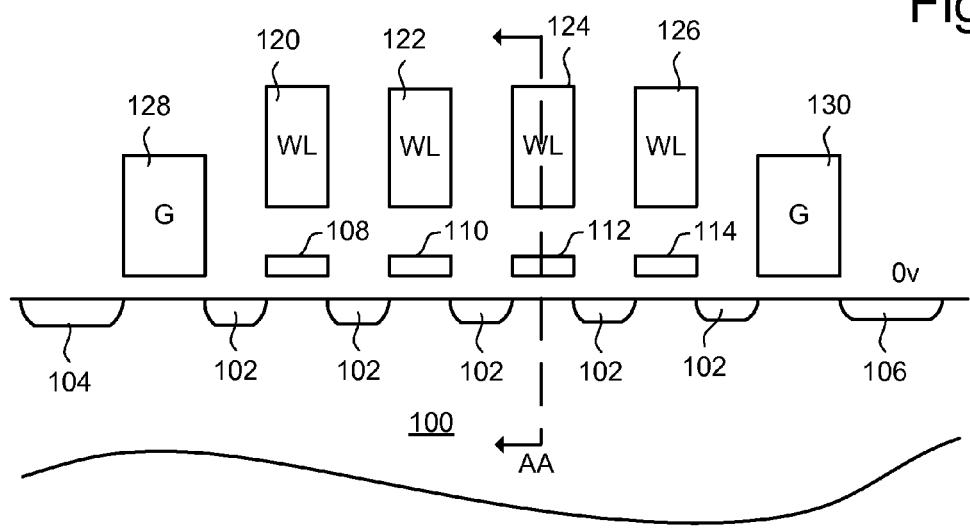
FIG. 1 is a cross sectional block diagram of one embodiment of a NAND string.

FIG. 1 provides a cross sectional view of one embodiment of a NAND string. Each of the transistors of the NAND string are created in active area 100 of a P-well. In the example of FIG. 1, the NAND string includes four memory cells. However, in other embodiments, a NAND string can include more or less than four memory cells. The NAND string includes source/drain regions 102 in the active area 100. Above active area 100 are four stacked gate structures representing the four memory cells. Each of the stacked gate structures includes a charge storage layer (see charge storage layers 108, 110, 112, 114) and a control gate/word line (see WL 120, 122, 124 and 126). One example of a charge storage layer is a charge trapping layer made from silicon nitride ("nitride"), or other suitable material. A drain side select transistor connects the NAND string to bit line contact 106. The drain side select transistor is turned on or off by properly biasing its gate 130. A source side select transistor connects the NAND string to source line 104 by properly biasing the gate 128. The four memory cells of the NAND string share a common channel region in active area 100 between and below the source/drain regions 102.

Figure 2:
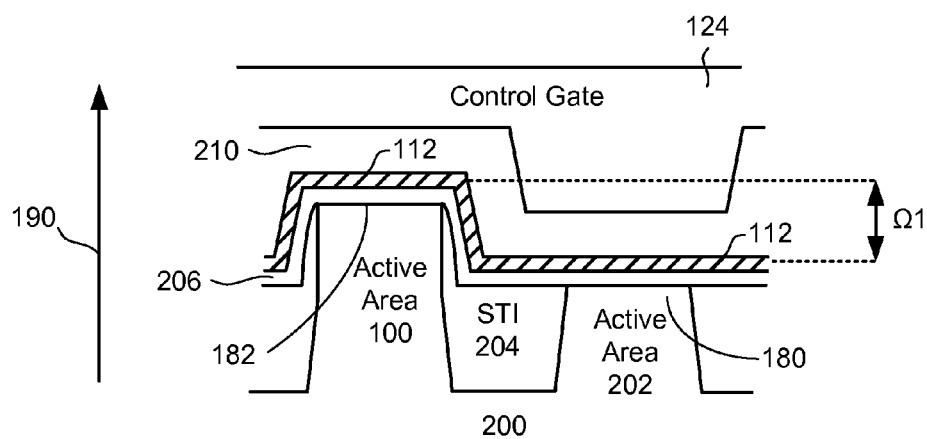
FIG. 2 depicts a cross section of the device of FIG. 1.

FIG. 2 depicts a cross section of the device of FIG. 1, cut along the dashed line AA. The view of FIG. 2 shows a cross section of two NAND strings. A first NAND string is associated with active area 100. The second NAND string is associated with active area 202. Thus, while FIG. 1 only shows one NAND string, FIG. 2 shows portions of two NAND strings that are on the same active layer. Both active areas 100 and 202 are in p-well 200, which is part of the substrate for the memory system. As can be seen, active area 100 is taller/deeper than active area 202. That is, the top surface (referred to as the active surface) of active area 100 is vertically offset from the top surface (active surface) of active area 202. The offset is vertical with respect to the substrate. In between active area 100 and active area 202 is a shallow trench isolation region 204, which can be filled with silicon dioxide ("oxide") or other dielectric. Above active areas 100 and 202 is a first oxide layer 206 which serves as a dielectric between the charge storage layer and the substrate. Above dielectric layer 206 is charge storage layer 112. Above the charge storage layer 112 is inter-gate dielectric region 210, which can include oxide. Above dielectric layer 210 is the control gate or word line layer 124. In one embodiment, control gate or word line layer 124 comprises TaN. As can be seen, in one embodiment, layers 124, 210, 112 and 206 run across multiple NAND strings. The structure of FIGS. 1 and 2 is sometimes called a MONOS structure because the layers, in some embodiments, include metal, oxide, nitride, oxide, silicon (substrate).

As explained above, the top surface of active area 100 is vertically offset from the top surface of active area 202, with respect to the substrate. Because of this offset of the active areas, the layers of oxide and charge storage material added on top of the active areas are also offset. In the example of FIG. 2, the offset of the charge storage regions of the neighboring NAND strings is similar in magnitude to the offset of the top surfaces of the respective active areas. FIG. 2 shows an offset $\Omega 1$ to indicate the offset between the charge storage layer 112 for the NAND string associated with active area 100 and the charge storage area 112 associated with the NAND string of active area 202. As can be seen from FIG. 2, the offset is significantly greater than a thickness of charge trapping layer 112. In one embodiment, charge trapping layer 112 is 5 nm thick, while the offset is 20-40 nm. In some embodiments, the thickness of the charge trapping layer can vary among the different memory cells; however, the offset will still be significantly greater than any of the thicknesses of the various charge trapping layers.

Figure 3:
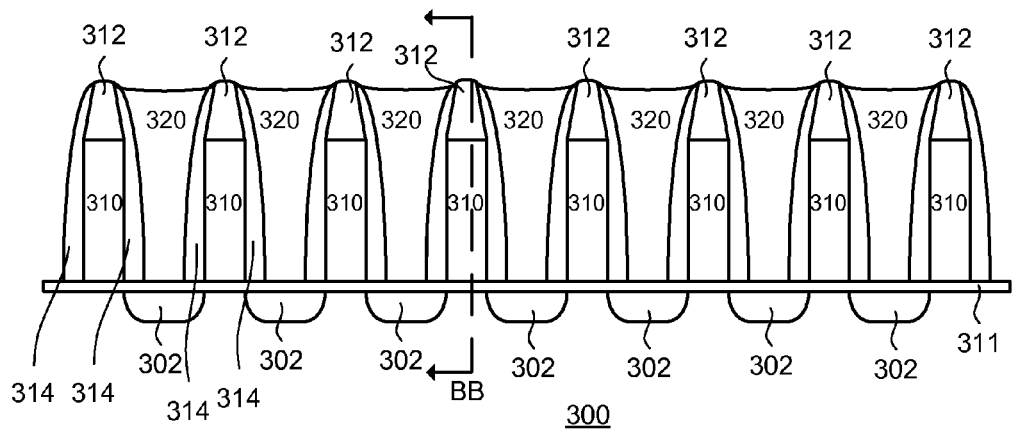
FIG. 3 is a cross sectional block diagram of one embodiment of a NAND string.

FIG. 2 only shows a portion of a block of NAND strings. A full block of NAND strings includes layers 124, 210, 112 and 206 continuing across all of the NAND strings of the block. The NAND strings of the block are positioned on a common active layer and are divided into two interleaved groups of NAND strings. A first group of NAND strings is formed on a set of active areas analogous to active area 100 and a second group of NAND strings is formed on a set of active areas analogous to active area 202. Therefore, the first group would be at a first vertical height based on the top surfaces of active areas 100 and the second group would be at a second vertical height based on the top surfaces of active areas 202. Because the NAND strings are arranged along a common active layer, the NAND strings are positioned at a distance (fixed or varied) from each other in a horizontal direction and, as explained above based on the difference in height of the top surfaces of actives areas 100 and 202, offset in a vertical direction from neighbor NAND strings. With such an arrangement, the respective portions of the charge trapping layer 112 of each memory cell coupled to a common word line are offset from their neighbors in the horizontal direction and the vertical direction, with the horizontal direction being perpendicular to the vertical direction FIG. 3 depicts a cross sectional view of another embodiment of a NAND string. The NAND string is implemented in active area 300 of a p-well. Implanted in the p-well are source drain regions 302. Each of the memory cells of the NAND string includes a floating gate 310, an oxide pad layer 312 on top of floating gate 310, and oxide dielectric layer 311 between the floating gate 310 and active area 300 of the p-well. The floating gates are another example of a charge storage layer. Although eight memory cells are depicted in FIG. 3, more or less than eight memory cells can be implemented in the NAND string. The NAND string also includes word lines forming control gates 320. In between the control gates 320 and the floating gates 310 are inter-gate dielectric regions 314. In one embodiment, the inter-gate dielectric regions are made of oxide and the floating gates are made of polycrystalline silicon ("polysilicon" or "poly"). In the embodiment of FIG. 3, each floating gate can be controlled using two control gates.

Figure 4:
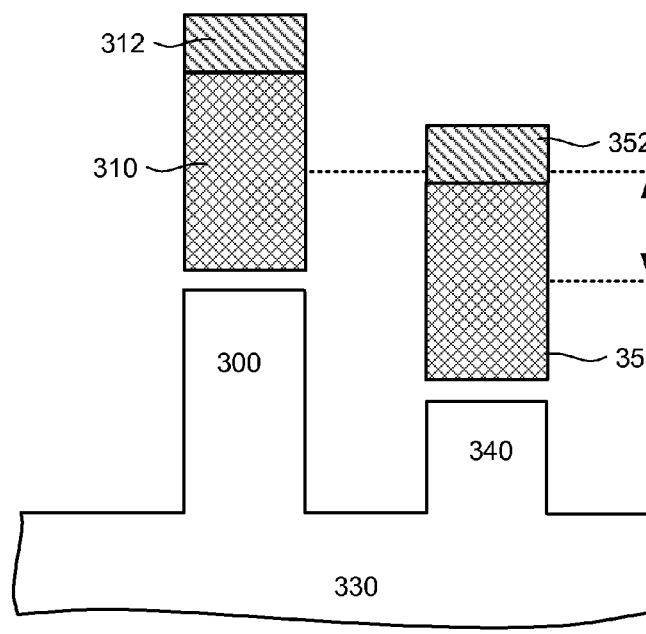
FIG. 4 depicts a cross section of the device of FIG. 3.

A cross sectional view of the device of FIG. 3 along dashed lines BB is depicted in FIG. 4. As shown, p-well 330 (which is part of the substrate) includes active area 300 and active area 340. Each of the active areas are associated with a different NAND string. Because FIG. 4 is a cut away view, one memory cell for two NAND strings are depicted. The first NAND string includes floating gate 310 and oxide pad layer 312. The second NAND string includes floating gate 350 and oxide pad layer 352. Because the top surface of active area 300 is offset from the top surface of active area 340 (due to active area 300 being deeper than active area 340), floating gate 310 is offset from floating gate 350. For example, the middle of floating gate 310 is offset from the middle of floating gate 350 by an amount depicted in FIG. 4 as $\Omega 2$. More information about the type of NAND string shown in FIG. 3 can be found in U.S. Pat. No. 7,075,823, titled "Flash Memory Cell Arrays Having Dual Control Gates per Memory Cell Charge Storage Element," incorporated herein by reference in its entirety.

Figure 5:
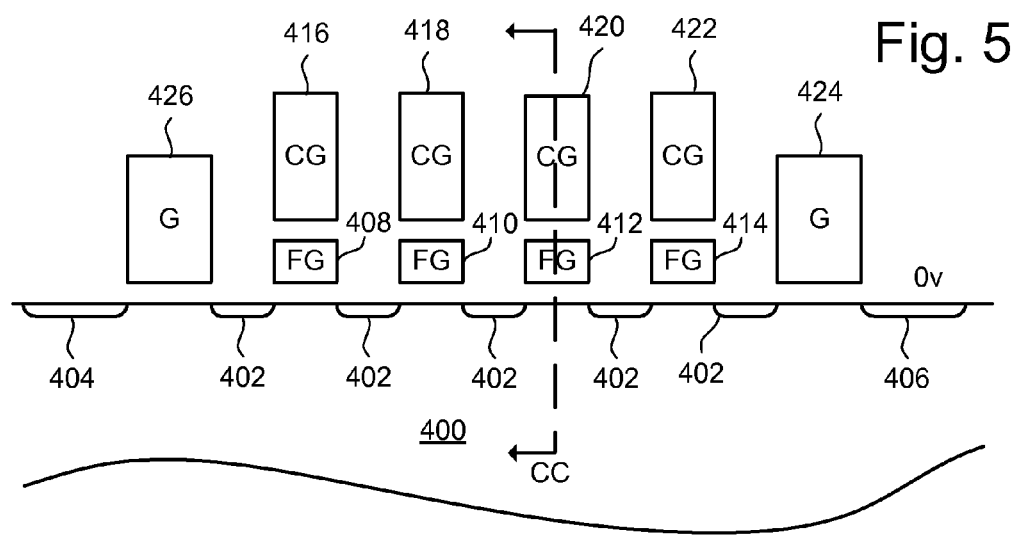
FIG. 5 is a cross sectional block diagram of one embodiment of a NAND string.

FIG. 5 depicts a cross sectional view of another embodiment of a NAND string. FIG. 5 shows active area 400 of a p-well having implant regions forming source/drain regions 402. Above the surface of active area 400 are four floating gates 408, 410, 412 and 414. Above each of the floating gates are respective control gates 416, 418, 420 and 422. Although four memory cells are depicted in the NAND string of FIG. 5, more or less than four memory cells can be used. The NAND string is connected to bit line contact 406 using a drain side select transistor having a gate 424. The NAND string is connected to common source line 404 by a source side select transistor having a gate 426.

Figure 6:
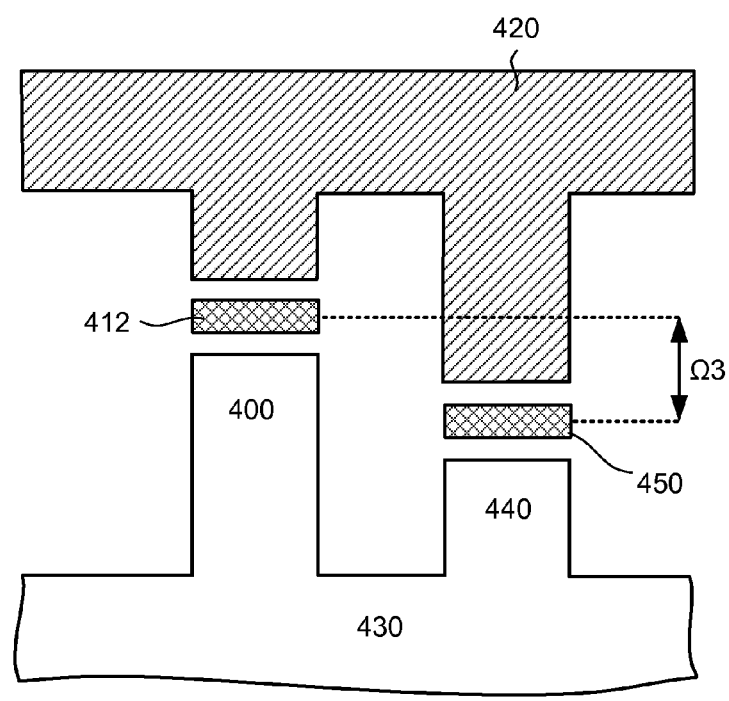
FIG. 6 is a cross section of the device of FIG. 5.

FIG. 6 shows a cross section view of the device of FIG. 5 along dashed line CC. FIG. 6 shows word line 420 forming the control gates of memory cells on two different NAND strings. A first NAND string is on active area 400. A second NAND string is on active area 440. Both active areas 400 and 440 are part of p-well 430, which is part of the substrate. As can be seen from FIG. 6, active area 400 has a top surface which is vertically offset from the top surface of active area 440, with respect to the substrate. As a result, floating gate 412 is offset from floating gate 450 in a vertical direction, with respect to the substrate, by an amount indicated in FIG. 6 as $\Omega 3$. Note that the distance $\Omega 3$ is larger than the thickness of floating gates 414 and 450.

In the three embodiments discussed above, the neighboring NAND strings are vertically offset from each other through the difference in depth of the active areas that the NAND strings are built upon. By offsetting the NAND strings, each of the individual memory cells are vertically offset from neighboring memory cells (in the word line direction) of the neighboring NAND string. Consequently charge storage layers of memory cells that are neighboring memory cells along the word line direction are offset from each other in the vertical direction.

The reference to "vertical direction" is used with respect to the substrate (which includes the p-well). The direction perpendicular to the surface of the substrate is referred to as vertical, with respect to the substrate. Thus, even if the substrate is turned on its side, for purposes of this document, the direction perpendicular to the substrate will still be considered vertical with respect to the substrate. For example, the arrow 190 of FIG. 2 indicates the vertical direction with respect to the substrate.

By offsetting NAND strings, and consequently offsetting charge storage regions, interference of a charged storage region from its neighboring charge storage region (in the word line direction) and/or neighboring channel (in the word line direction) is reduced.

Note that although FIGS. 1-6 depict NAND strings, the technology described herein can be applied to other nonvolatile storage.

Figure 7A:
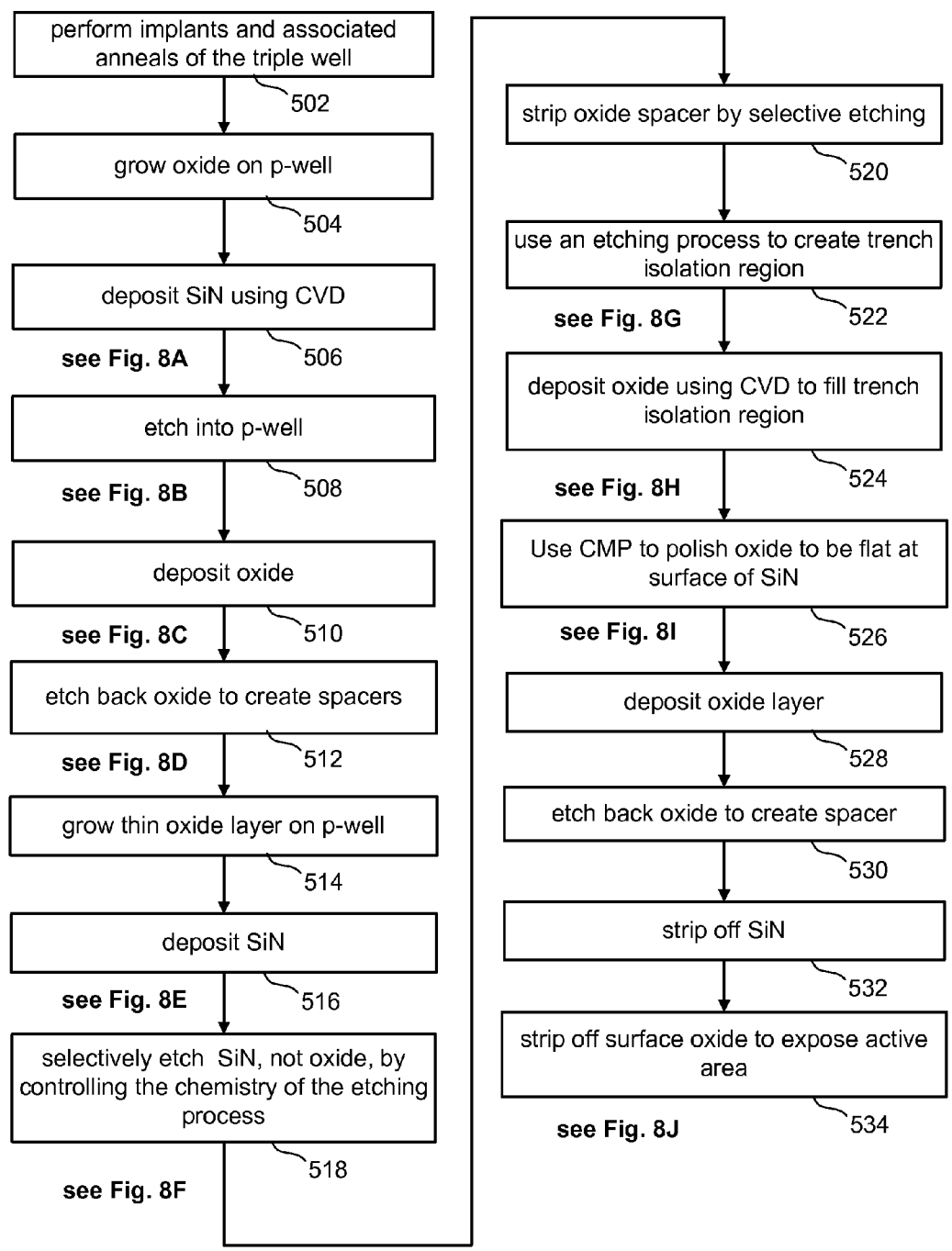
FIGS. 7A and 7B depict one embodiment of a process for fabricating non-volatile storage.
Figure 7B:
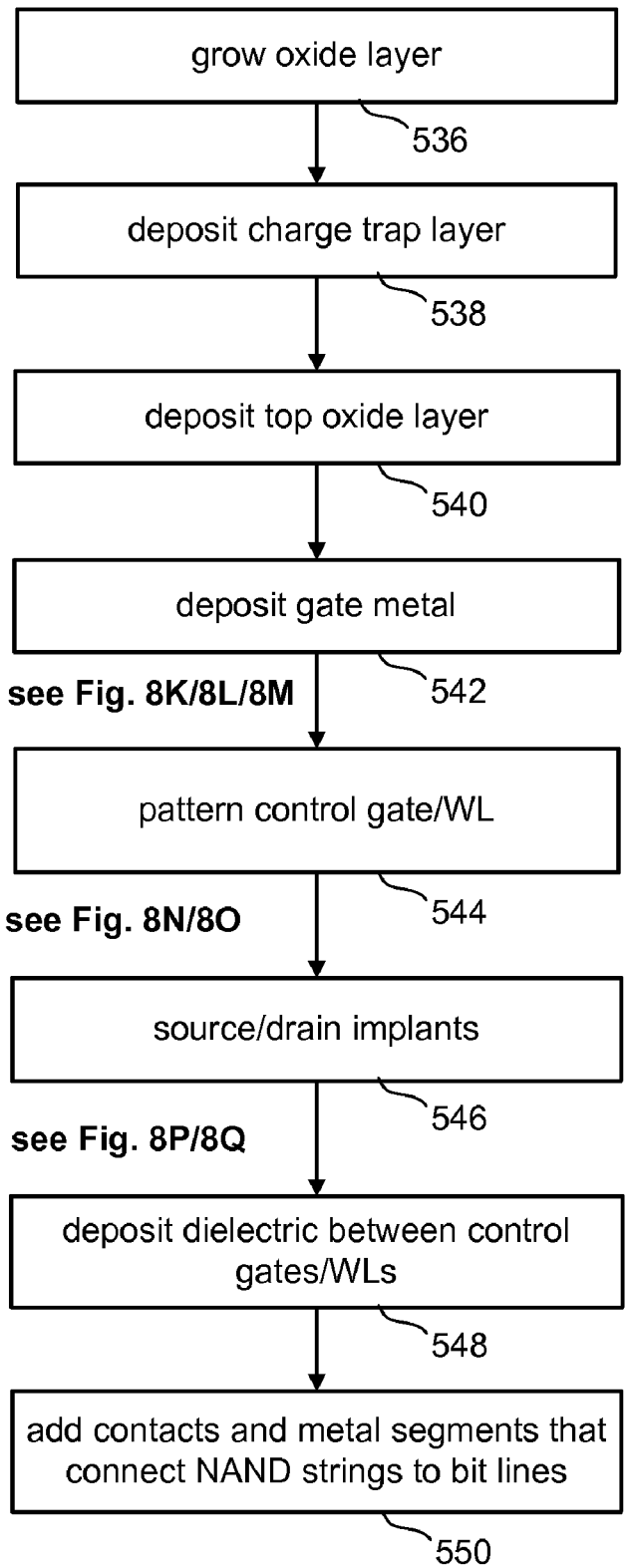
Figure 8A:
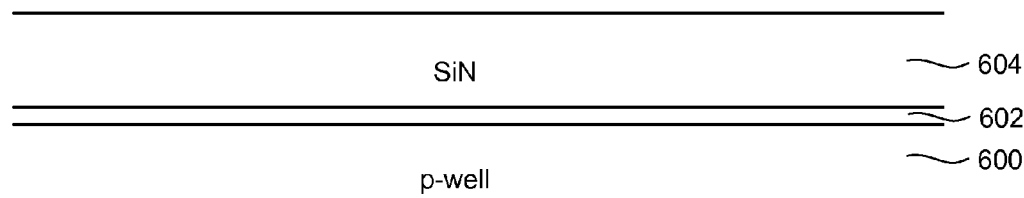
FIGS. 8A-8Q depict example non-volatile storage in various phases of fabrication.

FIGS. 7A and 7B depict a process for fabricating non-volatile storage with memory cells offset from neighboring memory cells in order to reduce interference from neighboring memory cells or channels. For example, the process of FIGS. 7A and 7B can be used to fabricate memory cells with a structure as depicted in FIG. 2. Step 502 includes performing implants and associated anneals of triple wells, which comprise a base P substrate, a n-well and a p-well. The base P substrate is usually the thickest layer of the substrate consisting of the majority of the wafer thickness. The n-well is part of the substrate and within the base P substrate. The p-well, which is part of the substrate, is within the n-well. The n-well depth is typically much thicker than that of the p-well. The P substrate and the n-well are not depicted in the drawings in order to simplify the drawings. In step 504, an oxide layer is grown on the top surface of the p-well. In step 506, a nitride layer is deposited on top of the oxide layer using CVD (Chemical Vapor Deposition). FIG. 8A depicts the results after steps 502-506. FIG. 8A shows p-well 600. On top of p-well 600 is oxide layer 602. On top of oxide layer 602 is nitride layer 604.

Figure 8B:
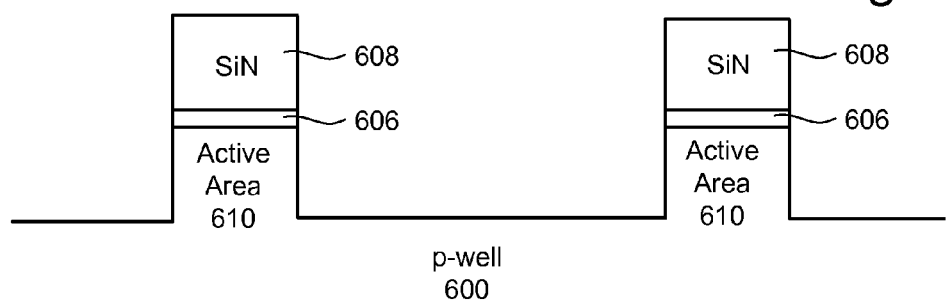

In step 508, an etching process is used to etch into the P-well in order to create a set of active areas. The result of the etching process, depicted in FIG. 8B, includes a substrate with active area 610. On top of active areas 610 are oxide regions 606 and nitride regions 608. Oxide regions 606 are the remnants of the oxide layer 602 after etching. Nitride regions 608 are the remnants of nitride layer 604 after etching. In one embodiment, when etching, photolithography is used with a mask. For example, a hard mask can be deposited. Photolithography can be used to form strips of photoresist. The hard mask is then etched through using anisotropic plasma etching (i.e. active ion etching with the proper balance between physical and chemical etching for each plane or layer encountered). After the hard mask layer is etched into strips (or other appropriate shapes), the photo resist can be stripped away and the hard mask layer can be used as the mask for etching the underlying layers. The process then includes etching through the appropriate layers of material.

Figure 8C:
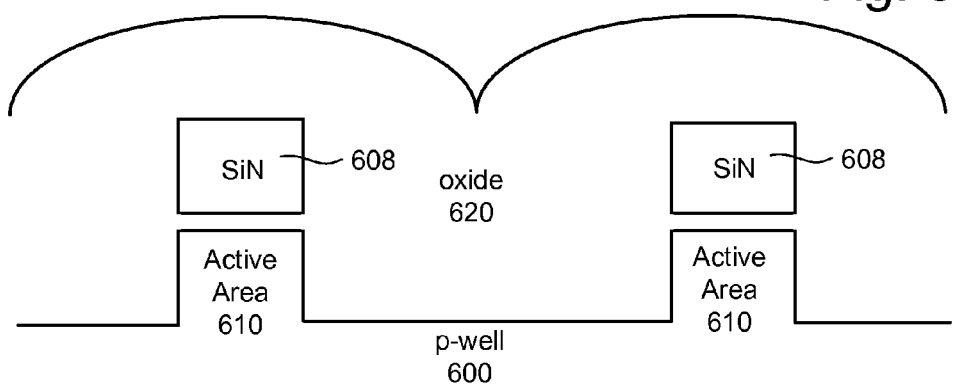
Figure 8D:
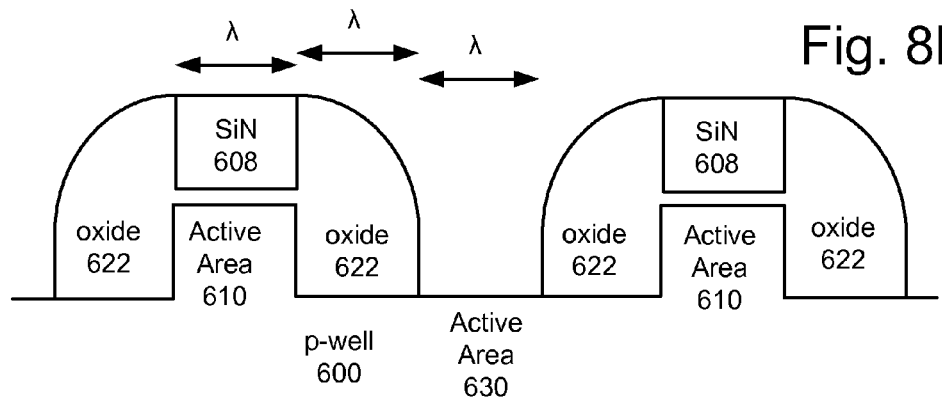

In step 510, oxide is deposited over the P-well and active areas. For example, FIG. 8C shows oxide 620. In step 512, an etching process is used to etch back oxide 620 to form oxide spacers 622 on each side of the active area 610/SiN (nitride) 608 stacks. For example, FIG. 8D shows oxide spacers 622 on either side of active areas 610 (as well as be on either side of nitride regions 608). Note that the width of active area 610 is noted as λ, the width of the oxide spacers 622 is λ and the space between oxide spacers 622 is also at a width of X. This symmetry will provide for an additional active area to be placed between active areas 610.

Figure 8E:
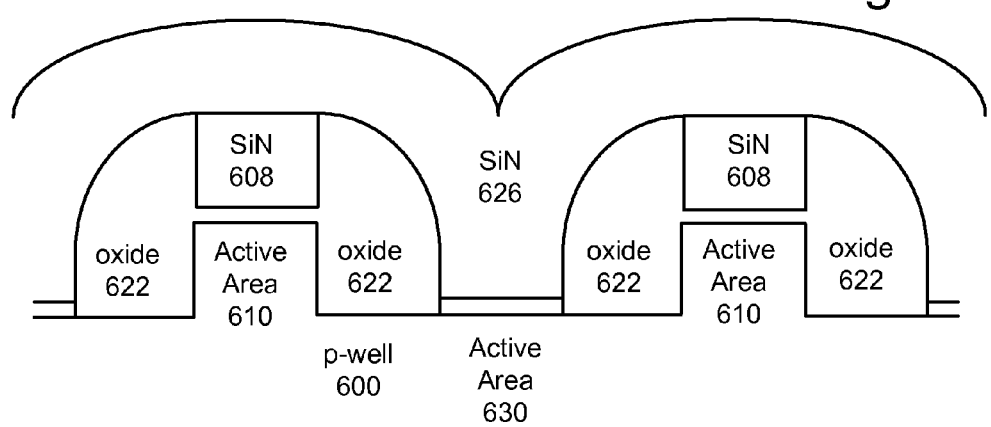

In step 514, a thin oxide layer is grown on the top surface of p-well 600. In step 516, a nitride layer is deposited on the oxide layer of step 514 and on top of active area 610/SiN 608 stacks. FIG. 8E shows the results after step 516.

Figure 8F:
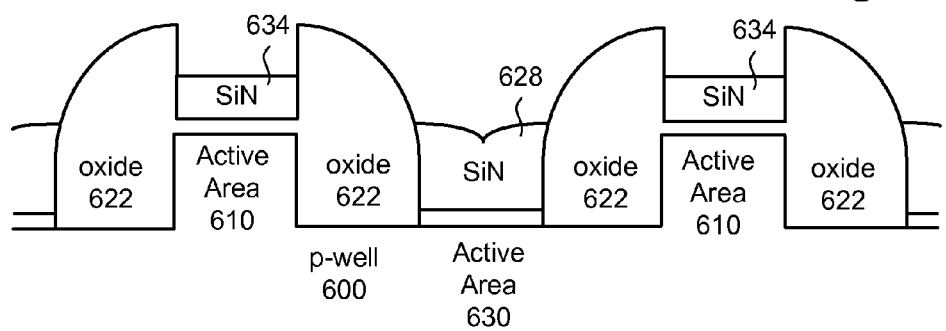

In step 518, nitride layer 626 is selectively etched so that part of nitride layer 626 is removed, and part of nitride layer 608 is removed; however, oxide layers are not removed. The selective etch can be performed by controlling the chemistry of the etching process, which is well known in the art. The results of this selective etching process is depicted in FIG. 8F, which shows that nitride region 608 had been etched down to nitride region 634 and nitride layer 626 was etched down to nitride region 628.

Figure 8G:
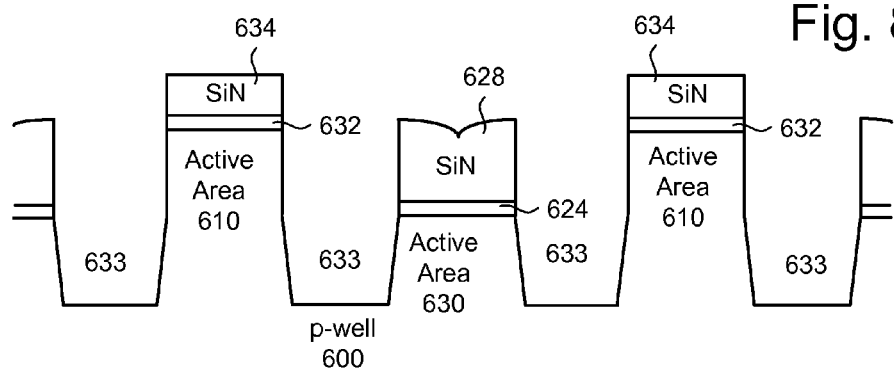

In step 520, the oxide spacers 622 are stripped by selective etching. In step 522, an etching process is used to create the shallow trench isolation regions. For example, FIG. 8G shows shallow trench isolation regions 633 after step 522. The etching to create the shallow trench isolation regions also patterns the active areas. For example, there are now two sets of active areas. A first set of active areas (active areas 610) include every other NAND string. These active areas 610 have a top surface at a first vertical height with respect to the substrate. A second set of active areas corresponds to a second set of NAND strings which are also every other NAND string and are interleaved with the first set of active areas of the first set of NAND strings. The second set of active areas has a top surface which has a second vertical height with respect to the substrate. As can be seen from FIG. 8G, the top surface of active areas 630 is lower than the top surface of active areas 610.

Figure 8H:
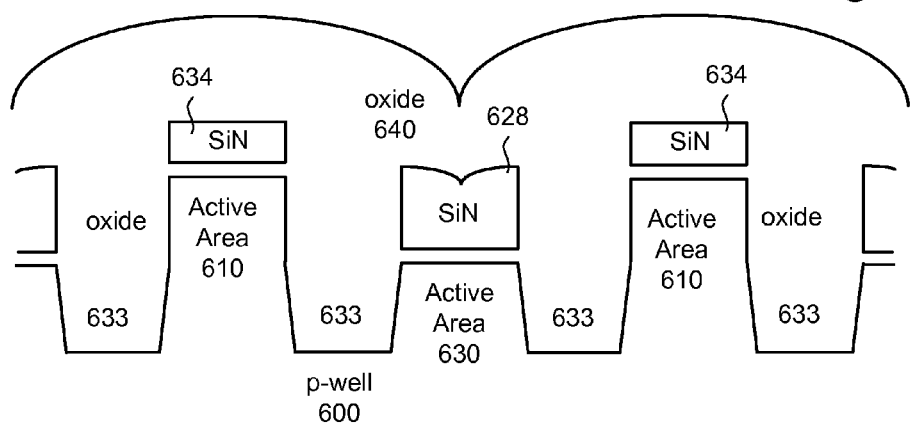
Figure 8I:
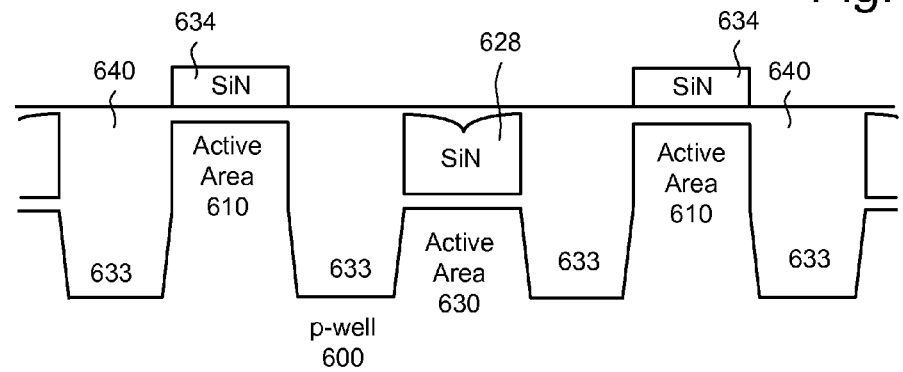

In step 524, oxide is deposited using CVD to fill the shallow trench isolation regions 633. For example, FIG. 8H shows oxide 640 filling shallow trench isolation regions 633. In step 526, CMP (Chemical Mechanical Polishing) is used to polish oxide region 640 and is combined with an oxide etch back step to recess oxide region 640 to the lower surface of nitride regions 634, as depicted in FIG. 8I.

Figure 8J:
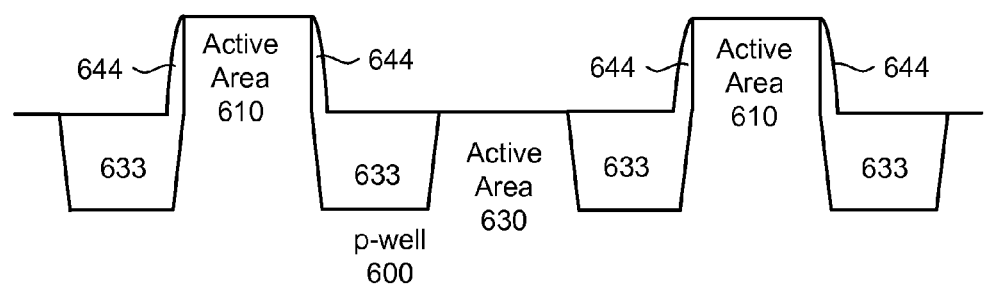

In step 528, another oxide layer is deposited. In step 530, that newly deposited oxide layer is etched back to create spacers. In step 532, the nitride regions are stripped off (removing nitride regions 634 and 628). In step 534, surface oxide is stripped off to expose the active areas. The results after step 534 are depicted in FIG. 8J which shows oxide spacers 644 and also depicts that the top surfaces of the active areas are exposed.

Figure 8K:
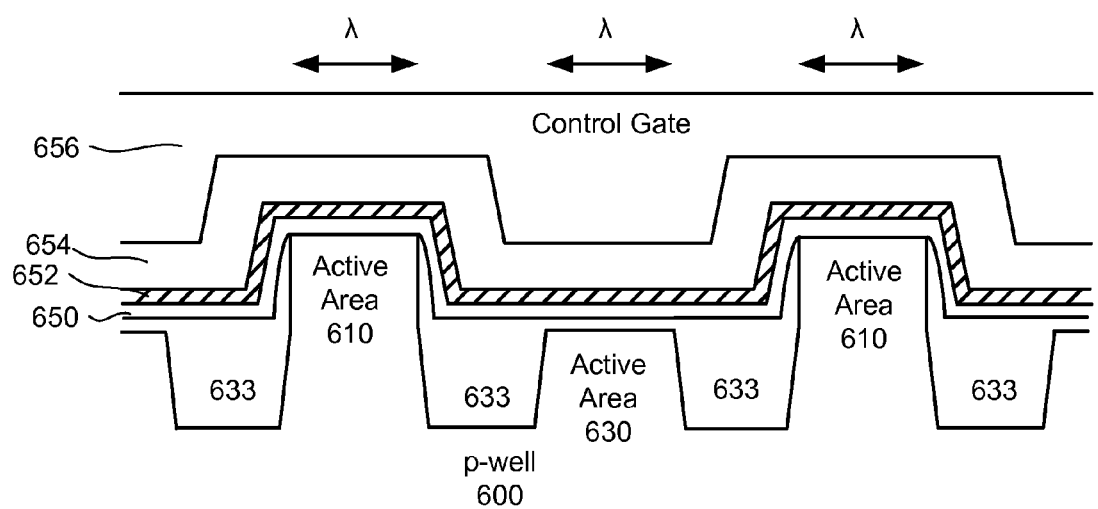

The process of FIG. 7A continues in FIG. 7B. In step 536, another oxide layer is grown or deposited on the top surface of the structure. In step 538, a charge trap layer (e.g. nitride) is deposited on top of the oxide layer of step 536. In step 540, another oxide layer is deposited on top of the charge trap layer. In step 542, a metal layer is deposited on top of the oxide layer of step 540. The result after step 542 is depicted in FIG. 8K, which shows lower oxide layer 650 above the active areas. Charge trap layer 652 is on top of lower oxide layer 650. Upper oxide layer 654 is on top of charged trap layer 652. Metal layer 656, which functions as a control gate, is on top of top oxide layer 654. Because a charge trap layer was deposited on top of the active areas and neighboring active areas have top surfaces that are offset from each other (due to the difference in depth of the active areas) the charged trap layer for each NAND string is at a different vertical position. For example, charge trap layer 652 is at a higher vertical position (with respect to the substrate) over active areas 610 than over active areas 630.

The structure of FIG. 8K is the same as the structure of FIG. 2. For example, oxide 650 is analogous to oxide 206, charge trap layer 652 is analogous to charge trap layer 112, oxide 654 is analogous to oxide 210, and metal layer 656 is analogous to control gate layer 124. FIG. 8K also shows that the width of active areas 610 and 630 are λ.

Figure 8L:
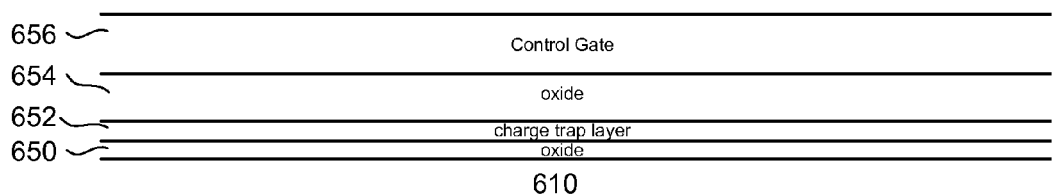
Figure 8M:
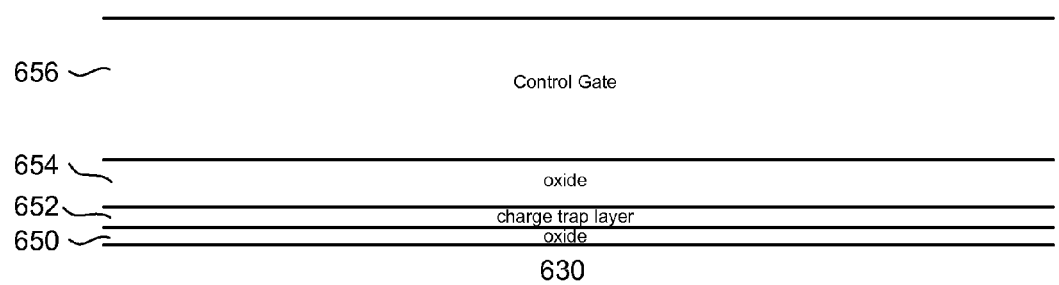

The view of the multiple NAND strings of FIG. 8K (e.g., in this case there are three NAND strings depicted) is in a direction along the word line (layer 656). FIGS. 8L and 8M provide a view of the structure of FIG. 8K in a perpendicular direction to that of FIG. 8K. Thus, the views of FIGS. 8L and 8M are perpendicular to the word line, but parallel to a bit line and parallel to a NAND string. FIG. 8L depicts a cut away view along active area 610 of a NAND string that is vertically higher (e.g. active area 630). FIG. 8M is a cross section view along active area 630, which depicts a NAND string that is lower in height (e.g. active area 610). Both FIGS. 8L and 8M depict active areas, oxide layer 650 above active areas 610/630, charge trap layer 652 above oxide layer 650, oxide layer 654 above charged trap layer 652, and metal layer 656 above oxide layer 654.

Figure 8N:
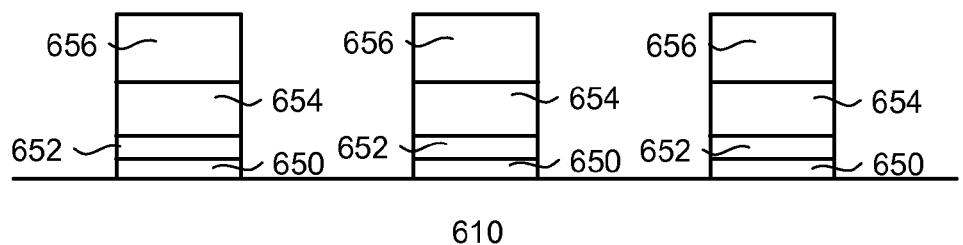
Figure 8O:
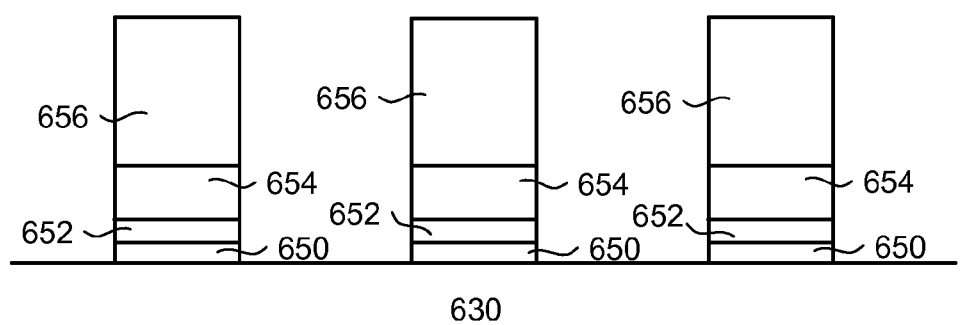

In step 544, the various word lines are patterned. In one embodiment, lithography and etching can be used to remove portions of metal layer 656, oxide layer 654, charge trap layer 652, and oxide layer 650 to pattern the word lines and create the stacks for each of the memory cells in a NAND string. The results of step 544 are depicted in FIGS. 8N and 8O. FIG. 8N corresponds to the structure of FIG. 8L. FIG. 8O corresponds to the structure of FIG. 8M. As can be seen, layers 650-656 are patterned into the various memory cells. Each stack corresponds to one memory cell. Note that the control gate layer 656 is deeper in FIG. 8O than in FIG. 8N.

Figure 8P:
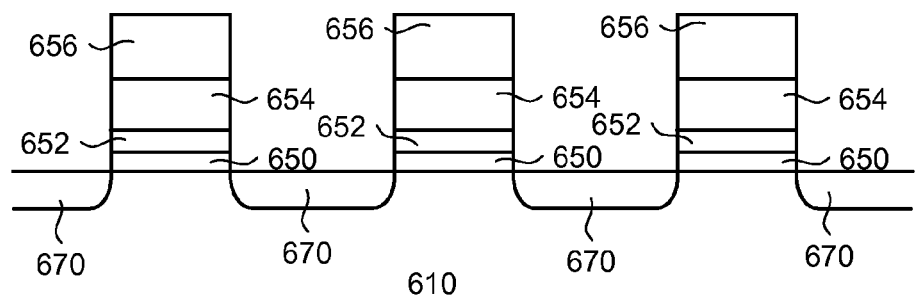
Figure 8Q:
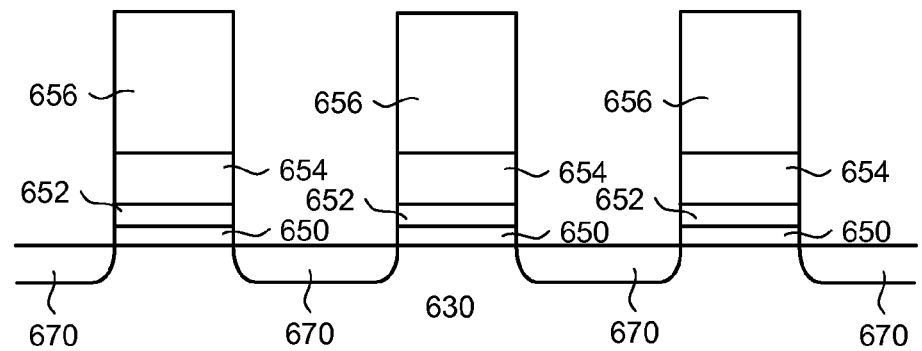

In step 546, source/drain implantation is performed to create source/drain regions 670 between the memory cell stacks. The result of step 546 is depicted in FIGS. 8P and 8Q. FIG. 8P corresponds to the structure of FIG. 8N. FIG. 8Q corresponds to the structure of FIG. 8O.

In step 548, dielectric material is deposited between the control gates and memory cell stacks. In one embodiment, oxide is deposited. In step 550, contacts and metal segments are added to connect the NAND strings to the appropriate bit lines and source lines.

Figure 9:
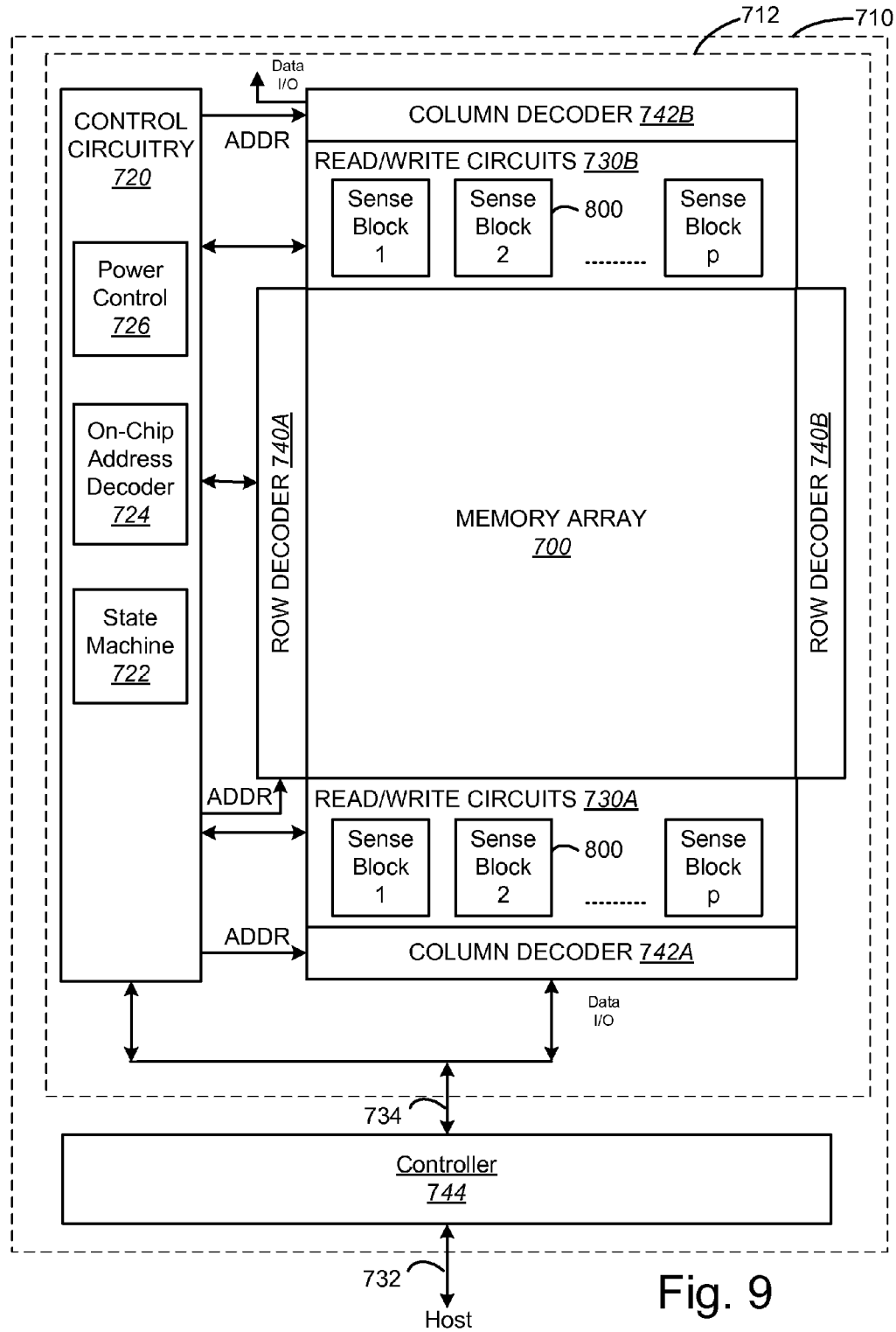
FIG. 9 is a block diagram of an example of a non-volatile storage system.

FIG. 9 illustrates a memory device 710 having read/write circuits for reading and programming a page (or other unit) of memory cells (e.g., NAND multi-state flash memory) in parallel. Memory device 710 may include one or more memory die or chips 712. Memory die 712 includes an array (two-dimensional or three dimensional) of memory cells 700, control circuitry 720, and read/write circuits 730A and 730B. In one embodiment, access to the memory array 700 by the various peripheral circuits is implemented in a symmetric fashion, on opposite sides of the array, so that the densities of access lines and circuitry on each side are reduced by half. The read/write circuits 730A and 730B include multiple sense blocks 800 which allow a page of memory cells to be read or programmed in parallel. The memory array 700 is addressable by word lines via row decoders 740A and 740B and by bit lines via column decoders 742A and 742B. Word lines and bit lines are examples of control lines. In a typical embodiment, a controller 744 is included in the same memory device 710 (e.g., a removable storage card or package) as the one or more memory die 712. Commands and data are transferred between the host and controller 744 via lines 732 and between the controller and the one or more memory die 712 via lines 734.

Control circuitry 720 cooperates with the read/write circuits 730A and 730B to perform memory operations on the memory array 700. The control circuitry 720 includes a state machine 722, an on-chip address decoder 724 and a power control module 726. The state machine 722 provides chip-level control of memory operations. The on-chip address decoder 724 provides an address interface between that used by the host or a memory controller to the hardware address used by the decoders 740A, 740B, 742A, and 742B. The power control module 726 controls the power and voltages supplied to the word lines and bit lines during memory operations. In one embodiment, power control module 726 includes one or more charge pumps that can create voltages larger than the supply voltage.

In one embodiment, one or any combination of control circuitry 720, power control circuit 726, decoder circuit 724, state machine circuit 722, decoder circuit 742A, decoder circuit 742B, decoder circuit 740A, decoder circuit 740B, read/write circuits 730A, read/write circuits 730B, and/or controller 744 can be referred to as one or more managing circuits. The one or more managing circuits perform the processes for erasing, programming and reading.

Figure 10:
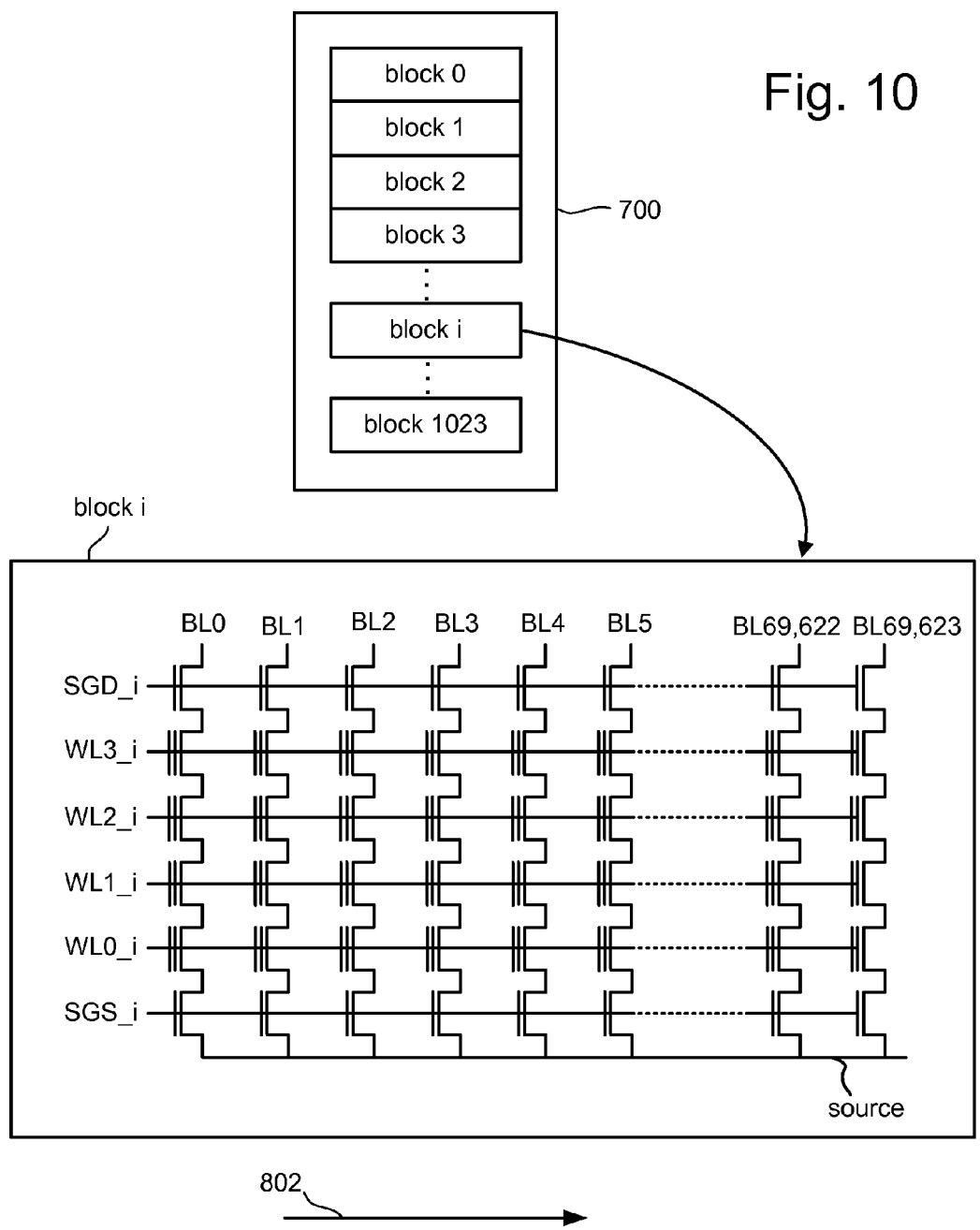
FIG. 10 is a block diagram of an example of a memory array that can be used in a non-volatile storage system.

FIG. 10 depicts an exemplary structure of memory cell array 700. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used. Thus, in one embodiment, the set of memory cells that are connected to a common word line (with every other memory cells vertically offset) are erased simultaneously.

A block contains a set of NAND stings which are accessed via bit lines (e.g., bit lines BL0-BL69623) and word lines (WL0, WL1, WL2, WL3). FIG. 10 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line (with every other memory cells vertically offset) are programmed simultaneously. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Using the processes described above, the various NAND strings of a block are arranged on a common substrate layer along a first direction noted by arrow 802 in FIG. 10. The NAND strings are vertically offset (with respect to the substrate) from neighbor NAND srings. For example, NAND strings connected to even bit lines (e.g. BL0, BL2, BL4, . . . ) are at a first vertical position and NAND strings connected to odd bit lines (e.g. BL1, BL3, BL5, . . . ) are at a second vertical position. Looking back at FIG. 8K, the NAND strings connected to even bit lines may be formed on active areas 610 while the NAND strings connected to odd bit lines may be formed on active areas 630. In this way a pattern exists where every other NAND string (and its charge storage region) is at the same vertical position, but two neighboring NAND strings are at different vertical positions. The vertical offset is in a second direction that is perpendicular to arrow 802 and is in the direction in/out of the page of FIG. 10. Thus, each memory cell along a common word line is horizontally offset and vertically offset from its neighbor memory cell along that same word line, where the horizontal direction is perpendicular to the vertical direction. Similarly, neighboring charge storage layers (along a word line direction) are horizontally offset and vertically offset from neighbor charge storage layers (even if they are connected).

Note that a neighbor NAND string is a NAND string that next to the NAND string of interest. A neighbor charge storage region is adjacent (bit line direction or word line direction) to the charge storage region of interest.

The article "Three Dimensionally Stacked NAND Flash Memory Technology Using Stacking Single Crystal Si Layers on ILD and TANOS Structure for Beyond 30 nm Node" Soon-Moon Jung et al., Electron Devices Meeting, 2006 IEDM '06, describes a NAND flash memory device that has multiple active layers stacked three dimensionally. Each active layer includes a set of active regions and an array of NAND strings. For the technology described herein with respect to FIG. 1-10 forms as set of NAND strings on a single active layer that are vertically offset as described herein such that an active layer may include substrate material patterned into at least two sets of active areas, with each set having a top surface at a different vertical height. Therefore, while the article cited above describes the use of multiple active layers, FIGS. 1-10 only show one active layer. The technology of FIGS. 1-10 can also be applied to multiple active layers.

The inventors also note that previous technology fabricated NAND strings of a common active layer at a common vertical height. Due to process variations, it is possible that some of the NAND strings were at a slightly different vertical height. These small variations are not offsets, but merely process variations that are within an acceptable range of error from the ideal manufacture of all NAND strings at the exact same height. The offsets described herein are intentional differences that are significantly greater than acceptable process variations.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
a first set of groups of non-volatile storage elements, each group of non-volatile storage elements of the first set includes adjacent non-volatile storage elements positioned on a surface of an active layer that is at a first height;
a second set of groups of non-volatile storage elements, each group of non-volatile storage elements of the second set includes adjacent non-volatile storage elements positioned on a surface of the active layer that is at a second height that is different than the first height, the first set of groups of non-volatile storage elements are interleaved with the second set of groups of non-volatile storage elements so that a particular non-volatile storage element in the first set of groups is offset in two perpendicular directions from neighbor non-volatile storage elements in the second set of groups.

2. A non-volatile storage apparatus according to claim 1, further comprising:
one or more managing circuits in communication with said first set of groups of non-volatile storage elements and said second set of groups of non-volatile storage elements.

3. A non-volatile storage apparatus according to claim 1, wherein:
the active layer includes substrate material patterned into a first set of active areas and a second set of active areas interleaved with said first set of active areas, said first set of active areas have a first depth and said second set of active areas have a second depth, the first set of groups of non-volatile storage elements are positioned on the first set of active areas, the second set of groups of non-volatile storage elements are positioned on the second set of active areas.

4. A non-volatile storage apparatus according to claim 1, wherein:
each group of non-volatile storage elements of the first set includes all of its non-volatile storage elements at the first height; and
each group of non-volatile storage elements of the second set includes all of its non-volatile storage elements at the second height.

5. A non-volatile storage apparatus, comprising:
a first set of NAND strings, each NAND string of the first set includes adjacent non-volatile storage elements at a first height; and
a second set of NAND strings, each NAND string of the second set includes adjacent non-volatile storage elements at a second height that is different than the first height, the first set of NAND strings are interleaved with the second set of NAND strings so that a particular non-volatile storage element in the first set of NAND strings is offset in two perpendicular directions from neighbor non-volatile storage elements in the second set of NAND strings.

6. A non-volatile storage apparatus according to claim 5, further comprising:
one or more managing circuits in communication with the first set of NAND strings and the second set of NAND strings.

7. A non-volatile storage apparatus according to claim 5, wherein:
first set of NAND strings and the second set of NAND strings are on a common active layer, the common active layer includes substrate material patterned into a first set of active areas and a second set of active areas interleaved with said first set of active areas, said first set of active areas have a first depth and said second set of active areas have a second depth, the first set of NAND strings are positioned on the first set of active areas, the second set of NAND strings are positioned on the second set of active areas.

8. A non-volatile storage apparatus according to claim 5, wherein:
each NAND string of the first set of NAND strings includes all of its non-volatile storage elements at the first height; and
each NAND string of the second set of NAND strings includes all of its non-volatile storage elements at the second height.

* * * * *